US009077300B1

(12) United States Patent
Abuelma'atti et al.

(10) Patent No.: US 9,077,300 B1
(45) Date of Patent: Jul. 7, 2015

(54) PREDISTORTION CIRCUIT WITH CONCAVE CHARACTERISTIC

(71) Applicant: KING FAHD UNIVERSITY OF PETROLEUM AND MINERALS, Dhahran (SA)

(72) Inventors: Muhammad Taher Abuelma'atti, Dhahran (SA); Abdullah M. T. Abuelma'atti, London (GB)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

(21) Appl. No.: 14/525,191

(22) Filed: Oct. 27, 2014

(51) Int. Cl.
  *H03F 1/32* (2006.01)
  *H03F 3/21* (2006.01)
  *G06F 17/50* (2006.01)
  *G06F 17/14* (2006.01)

(52) U.S. Cl.
  CPC .............. *H03F 1/3258* (2013.01); *H03F 3/21* (2013.01); *G06F 17/5045* (2013.01); *G06F 17/14* (2013.01); *H03F 2201/3215* (2013.01)

(58) Field of Classification Search
  USPC ................. 330/149; 455/114.3; 375/296–297
  See application file for complete search history.

(56) References Cited

U.S. PATENT DOCUMENTS

| 6,570,430 | B1 * | 5/2003 | Zhou .......................... 327/317 |
| 7,180,368 | B2 | 2/2007 | Hirose et al. |
| 7,385,447 | B1 | 6/2008 | Adar |
| 7,774,176 | B2 | 8/2010 | Rao et al. |
| 7,904,033 | B1 | 3/2011 | Wright et al. |
| 8,106,712 | B2 | 1/2012 | Lee et al. |
| 2005/0021319 | A1 | 1/2005 | Li et al. |
| 2007/0136045 | A1 | 6/2007 | Rao et al. |
| 2008/0042742 | A1 | 2/2008 | Linder et al. |
| 2010/0158155 | A1 | 6/2010 | Borkar et al. |

FOREIGN PATENT DOCUMENTS

CN    101388649 A    3/2009

* cited by examiner

*Primary Examiner* — Hieu Nguyen
(74) *Attorney, Agent, or Firm* — Richard C Litman

(57) ABSTRACT

The predistortion circuit with concave characteristic is developed from a novel functional model for class-AB solid-state bipolar amplifiers. The model, based on a Fourier sine-series is simple and can provide closed-form expressions for the intermodulation products resulting from exciting the power amplifier by a multi-sinusoidal signal. The special case of a two-tone equal-amplitude signal is considered in detail. The present model can be used to build a database for the intermodulation performance of the class-AB bipolar SSPAs excited by a multi-sinusoidal signal. Using this database, the diode-based predistortion circuit with concave characteristic for linearizing the class-AB solid-state power amplifier is designed.

6 Claims, 12 Drawing Sheets

PREDISTORTION CIRCUIT WITH CONCAVE CHARACTERISTIC

BACKGROUND OF THE INVENTION

1. Field of the Invention

The present invention relates to predistortion of nonlinear circuits/systems, and particularly to a predistortion circuit with concave characteristic that negates the convex distortion characteristic of a typical solid state power amplifier.

2. Description of the Related Art

Orthogonal frequency division multiplexing (OFDM), qaudri-phase shift keying (QPSK), and multicarrier code division multiple access (MC-CDMA) are widely used in wireless local area networks (WLAN). This is attributed to one or more of the following attractive features: large dynamic signal range, robustness against multi-path fading and impulsive noise, efficient usage of the available bandwidth, efficient digital signal processing, robustness in case of frequency selective channels, multiple access capability and narrow-band interference rejection. However, these modulation schemes are vulnerable to the nonlinear distortion introduced by the solid-state power amplifiers (SSPAs) widely used in wireless communication systems.

In designing SSPAs designers are facing two conflicting requirements. To increase the efficiency, SSPAs are usually driven into saturation. This would result in severe nonlinear distortion usually causing a spread of the amplified spectrum (spectral regrowth), affecting adjacent channels, in addition to inband intermodulation products, affecting the channel of interest. This would degrade the overall performance of the wireless communication system incorporating SSPAs. Prediction of the nonlinear performance of SSPAs, measured by its intermodulation performance, is therefore essential in order to evaluate the communication system performance. The availability of a mathematical model, for the transfer function, is a prerequisite for the prediction of the nonlinear performance of SSPAs. Inspection of the available literature reveals that a Cann model is widely used for modeling the transfer function of the SSPAs yet the Cann model can't predict the nonlinear performance observed in SSPAs operating at relatively low power levels. Moreover, the Cann model can't predict the sweet point; where a notch is observed in the intermodulation performance, of the SSPAs operating near saturation Thus, a technique for predicting the intermodulation performance of the SSPA; without recourse to complicated measurements, that can lead to the design of a concave characteristic solving the aforementioned nonlinearity problem is desired.

SUMMARY OF THE INVENTION

Here we propose a diode-based predistortion circuit with concave characteristic for linearizing the SSPA. To design the required concave characteristic a set of data representing the relationship between the amplitude of the intermodulation products and the input signal amplitude is required. This set of data can be obtained either using extensive measurements or from calculation using a mathematical model for the SSPA characteristics.

Since Cann model cannot be used for generating this set of data, here we propose an alternative model. The model, based on a Fourier sine-series is simple and can provide closed-form expressions for the intermodulation products resulting from exciting the power amplifier by a multi-sinusoidal signal. The circuit is designed using a set of data representing the relationship between the amplitude of the intermodulation products as a function of the input signal amplitude which is obtained either using extensive measurements or alternatively from calculations using a mathematical model for the SSPA. The special case of a two-tone equal-amplitude signal is considered in detail. The present model can be used to build a database for the intermodulation performance of the class-AB bipolar SSPAs excited by a multi-sinusoidal signal.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
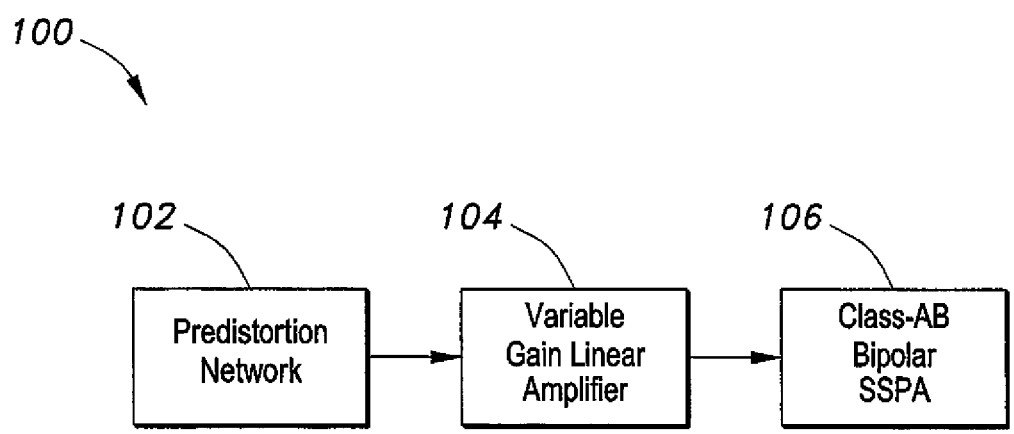
FIG. 1 is a block diagram of the predistortion circuit with concave characteristic according to the present invention.

The predistortion circuit with concave characteristic (shown as 102 in FIG. 1) utilizes a new functional model for class-AB solid-state bipolar power amplifiers. The model, based on a Fourier sine-series is simple and can provide closed-form expressions for the intermodulation products resulting from exciting the power amplifier by a multi-sinusoidal signal. The special case of a two-tone equal-amplitude signal is considered in detail. The present model can be used to build a database for the intermodulation performance of the class-AB bipolar SSPAs excited by a multi-sinusoidal signal. Using this database the diode-based predistortion circuit with concave characteristic for linearizing the class-AB solid-state power amplifier, is designed.

The aforementioned Cann model may be expressed as:

$$y = \frac{x}{(1+(x)^k)^{1/k}}. \quad (1)$$

In equation (1), $y=g_0 v_{out}/v_{sat}$ is the normalized output voltage, $x=g_0 v_{in}/v_{sat}$ is the normalized input voltage, $g_0$ is the small signal gain, $v_{sat}$ is the saturation input voltage and k is a parameter that sets the sharpness of compression characteristic. This model can produce smooth transition to saturation by adjusting the parameter k. Thus, it can be used for predicting the nonlinear performance of SSPAs working in or near the saturation region. However, in class-AB bipolar SSPAs, commonly used in mobile phones, there is some distortion at low power levels. For sufficiently small values of x and with k in the region of 5; as is usually recommended, equation (1) becomes a linear relationship between the normalized output and input voltages of the SSPA. Thus, the model of equation (1) cannot predict the nonlinear performance observed in SSPAs operating at relatively low power levels. Moreover, this model cannot predict the sweet point; where a notch is observed in the intermodulation performance, of the SSPAs operating near saturation. To incorporate these two phenomena, the model of equation (1) has been modified as shown in equation (2);

$$y = \frac{x}{(1+(x)^k)^{1/k}}(\tanh(x))^c. \quad (2)$$

In equation (2) the term $(\tan h(x))^c$, where c is a constant, represents the nonlinearity resulting from the weak conduction of the transistors at low power levels. In its present for, equation (2) cannot be used for predicting the nonlinear performance of class-AB bipolar SSPAs excited by a multi-sinusoidal signal. Therefore, recourse to numerical analysis and CAD-simulation tools is inevitable. Usually a power-swept two-tone signal is applied to the bipolar class-A13 SSPA model of equation (2), and the intermodulation product powers in the output are found by taking the FFT from the distorted signal at each power level. While successfully predicting the nonlinear performance of the class-AB bipolar SSPA, this approach is cumbersome, as it requires repeating the process for each power input. Moreover, it cannot reveal the effect of the parameters k and c on the nonlinear performance of the class-AB bipolar SSPA without performing an excessive number of iterations for different values of these parameters and the input power levels.

The major intention of the present predistortion circuit with concave characteristic is to utilize an alternative Fourier-series based model for the transfer function of bipolar class-AB SSPA. The parameters of this model are functions of the parameters k and c of the SSPA. The present model can provide closed-form expressions for the amplitudes of the intermodulation products resulting from exciting a class-AB bipolar SSPA by an arbitrary multi-sinusoidal input signal.

Using these expressions, the effect of the parameters k and c on the intermodulation performance can be easily studied and a database can be generated to help SSPA designers select the appropriate parameters to meet a predetermined intermodulation performance. Alternatively, the data can be used for designing a diode-based predistortion network for linearizing the class-AB solid-state power amplifier.

In the present predistortion circuit with concave characteristic the transfer function of the bipolar class-AB SSPA is modeled by the Fourier sine-series, $$y = \sum_{m=1}^{M} b_m \sin\left(\frac{2m\pi}{D}x\right). \quad (3)$$

In equation (3), the parameters D and $b_m$, m=1, 2, ..., M are fitting parameters that can be obtained using well known procedures for calculating Fourier coefficients of experimentally obtained waveforms. This procedure is simple and does not require extensive computing facilities or well-developed software. For convenience, a brief description of this procedure is given here. First, the normalized input-voltage output-voltage characteristic of the SSPA is either calculated, using equation (2), for a set of values of the parameters k and c, or obtained from the input-power output-power measurements; samples of the obtained characteristic are shown in plots 500-700 of FIGS. 5-7 for different values of the parameters k and c. Second, the resulting characteristic is mirror-imaged to produce a periodic function with a complete period=D. Third, this characteristic is approximated by a number of straight-line segments joined end to end. Fourth, using the slopes of these segments, it is easy to obtain the parameters $b_m$, m=1, 2, ..., M using simple algebraic calculations. Samples of the results obtained are shown in Tables 1-9 for different values of the parameters k and c.

TABLE 1

Variations of the Fourier-series coefficient $b_1$ with the parameters c and k.

| c = 0 | | c = 0.1 | | c = 0.25 | | c = 0.5 | | c = 1.0 | |
|---|---|---|---|---|---|---|---|---|---|
| k | $b_1$ | k | $b_1$ | k | $b_1$ | k | $b_1$ | k | $b_1$ |
| 2 | 0.9416 | 2 | 0.9235 | 2 | 0.8978 | 2 | 0.8583 | 2 | 0.7898 |
| 3 | 1.0354 | 3 | 1.0156 | 3 | 0.9874 | 3 | 0.9440 | 3 | 0.8684 |
| 4 | 1.0787 | 4 | 1.0580 | 4 | 1.0286 | 4 | 0.9834 | 4 | 0.9045 |
| 6 | 1.1148 | 6 | 1.0934 | 6 | 1.0630 | 6 | 1.0161 | 6 | 0.9343 |
| 8 | 1.1284 | 8 | 1.1067 | 8 | 1.0759 | 8 | 1.0284 | 8 | 0.9454 |
| 10 | 1.1348 | 10 | 1.1130 | 10 | 1.0819 | 10 | 1.0341 | 10 | 0.9505 |
| 16 | 1.1417 | 16 | 1.1198 | 16 | 1.0884 | 16 | 1.0402 | 16 | 0.9559 |

TABLE 2

Variations of the Fourier-series coefficient $b_3$ with the parameters c and k.

| c = 0 | | c = 0.1 | | c = 0.25 | | c = 0.5 | | c = 1.0 | |
|---|---|---|---|---|---|---|---|---|---|
| k | $b_3$ | k | $b_3$ | k | $b_3$ | k | $b_3$ | k | $b_3$ |
| 2 | 0.0757 | 2 | 0.0553 | 2 | 0.0277 | 2 | −0.012 | 2 | −0.072 |
| 3 | 0.0878 | 3 | 0.0658 | 3 | 0.0358 | 3 | −0.007 | 3 | −0.073 |
| 4 | 0.0963 | 4 | 0.0753 | 4 | 0.0425 | 4 | −0.002 | 4 | −0.070 |
| 6 | 0.1075 | 6 | 0.0840 | 6 | 0.0521 | 6 | 0.0061 | 6 | −0.065 |
| 8 | 0.1140 | 8 | 0.0903 | 8 | 0.0579 | 8 | 0.0114 | 8 | −0.060 |
| 10 | 0.1179 | 10 | 0.0940 | 10 | 0.0615 | 10 | 0.0147 | 10 | −0.058 |
| 16 | 0.1231 | 16 | 0.0991 | 16 | 0.0664 | 16 | 0.0192 | 16 | −0.054 |

TABLE 3

Variations of the Fourier-series coefficient $b_5$ with the parameters c and k.

| c = 0 | | c = 0.1 | | c = 0.25 | | c = 0.5 | | c = 1.0 | |
| --- | --- | --- | --- | --- | --- | --- | --- | --- | --- |
| k | $b_5$ | k | $b_5$ | k | $b_5$ | k | $b_5$ | k | $b_5$ |
| 2 | 0.0188 | 2 | 0.0091 | 2 | −0.003 | 2 | −0.017 | 2 | −0.031 |
| 3 | 0.0047 | 3 | −0.005 | 3 | −0.017 | 3 | −0.031 | 3 | −0.044 |
| 4 | −0.007 | 4 | −0.017 | 4 | −0.028 | 4 | −0.042 | 4 | −0.054 |
| 6 | −0.022 | 6 | −0.032 | 6 | −0.043 | 6 | −0.056 | 6 | −0.067 |
| 8 | −0.031 | 8 | −0.040 | 8 | −0.051 | 8 | −0.064 | 8 | −0.074 |
| 10 | −0.035 | 10 | −0.044 | 10 | −0.055 | 10 | −0.068 | 10 | −0.078 |
| 16 | −0.041 | 16 | −0.050 | 16 | −0.052 | 16 | −0.073 | 16 | −0.083 |

TABLE 4

Variations of the Fourier-series coefficient $b_7$ with the parameters c and k.

| c = 0 | | c = 0.1 | | c = 0.25 | | c = 0.5 | | c = 1.0 | |
| --- | --- | --- | --- | --- | --- | --- | --- | --- | --- |
| k | $b_7$ | k | $b_7$ | k | $b_7$ | k | $b_7$ | k | $b_7$ |
| 2 | 0.0 | 2 | −0.006 | 2 | −0.012 | 2 | −0.018 | 2 | −0.021 |
| 3 | −0.005 | 3 | −0.010 | 3 | −0.016 | 3 | −0.021 | 3 | −0.023 |
| 4 | −0.008 | 4 | −0.013 | 4 | −0.018 | 4 | −0.023 | 4 | −0.024 |
| 6 | −0.012 | 6 | −0.016 | 6 | −0.021 | 6 | −0.025 | 6 | −0.025 |
| 8 | −0.015 | 8 | −0.019 | 8 | −0.023 | 8 | −0.027 | 8 | −0.027 |
| 10 | −0.016 | 10 | −0.021 | 10 | −0.025 | 10 | −0.029 | 10 | −0.028 |
| 16 | −0.020 | 16 | −0.024 | 16 | −0.028 | 16 | −0.031 | 16 | −0.030 |

TABLE 5

Variations of the Fourier-series coefficient $b_9$ with the parameters c and k.

| c = 0 | | c = 0.1 | | c = 0.25 | | c = 0.5 | | c = 1.0 | |
| --- | --- | --- | --- | --- | --- | --- | --- | --- | --- |
| k | $b_9$ | k | $b_9$ | k | $b_9$ | k | $b_9$ | k | $b_9$ |
| 2 | −0.021 | 2 | 0.0 | 2 | −0.003 | 2 | −0.005 | 2 | −0.004 |
| 3 | 0.0 | 3 | −0.003 | 3 | −0.005 | 3 | −0.007 | 3 | −0.005 |
| 4 | 0.0 | 4 | −0.003 | 4 | −0.005 | 4 | −0.007 | 4 | −0.005 |
| 6 | 0.001 | 6 | −0.001 | 6 | −0.003 | 6 | −0.005 | 6 | −0.002 |
| 8 | 0.0040 | 8 | 0.0016 | 8 | −0.007 | 8 | −0.002 | 8 | 0.0 |
| 10 | 0.006 | 10 | 0.0038 | 10 | 0.0014 | 10 | 0.0 | 10 | 0.0017 |
| 16 | 0.010 | 16 | 0.0076 | 16 | 0.0071 | 16 | 0.0035 | 16 | 0.0049 |

TABLE 6

Variations of the Fourier-series coefficient $b_{11}$ with the parameters c and k.

| c = 0 | | c = 0.1 | | c = 0.25 | | c = 0.5 | | c = 1.0 | |
| --- | --- | --- | --- | --- | --- | --- | --- | --- | --- |
| k | $b_{11}$ | k | $b_{11}$ | k | $b_{11}$ | k | $b_{11}$ | k | $b_{11}$ |
| 2 | −0.001 | 2 | −0.003 | 2 | −0.005 | 2 | −0.006 | 2 | −0.006 |
| 3 | −0.001 | 3 | −0.003 | 3 | −0.005 | 3 | −0.006 | 3 | −0.005 |
| 4 | 0.0 | 4 | −0.002 | 4 | −0.004 | 4 | −0.005 | 4 | −0.004 |
| 6 | 0.0018 | 6 | 0.0 | 6 | −0.002 | 6 | −0.003 | 6 | −0.003 |
| 8 | 0.0033 | 8 | 0.0013 | 8 | 0.0 | 8 | −0.002 | 8 | −0.002 |
| 10 | 0.0043 | 10 | 0.0023 | 10 | 0.0 | 10 | −0.001 | 10 | −0.001 |
| 16 | 0.0064 | 16 | 0.0044 | 16 | 0.0039 | 16 | 0.0006 | 16 | 0.0 |

TABLE 7

Variations of the Fourier-series coefficient $b_{13}$ with the parameters c and k.

| c = 0 | | c = 0.1 | | c = 0.25 | | c = 0.5 | | c = 1.0 | |
| --- | --- | --- | --- | --- | --- | --- | --- | --- | --- |
| k | $b_{13}$ | k | $b_{13}$ | k | $b_{13}$ | k | $b_{13}$ | k | $b_{13}$ |
| 2 | 0.0009 | 2 | 0.0 | 2 | −0.001 | 2 | −0.002 | 2 | −0.001 |
| 3 | 0.0004 | 3 | 0.0 | 3 | −0.002 | 3 | −0.002 | 3 | −0.001 |
| 4 | 0.0004 | 4 | −0.001 | 4 | −0.002 | 4 | −0.002 | 4 | −0.001 |
| 6 | 0.0002 | 6 | −0.001 | 6 | −0.002 | 6 | −0.002 | 6 | −0.001 |
| 8 | 0.0 | 8 | −0.002 | 8 | −0.003 | 8 | −0.003 | 8 | −0.002 |
| 10 | −0.001 | 10 | −0.003 | 10 | −0.004 | 10 | −0.004 | 10 | −0.003 |
| 16 | −0.003 | 16 | −0.005 | 16 | −0.005 | 16 | −0.006 | 16 | −0.005 |

TABLE 8

Variations of the Fourier-series coefficient $b_{15}$ with the parameters c and k.

| c = 0 | | c = 0.1 | | c = 0.25 | | c = 0.5 | | c = 1.0 | |
| --- | --- | --- | --- | --- | --- | --- | --- | --- | --- |
| k | $b_{15}$ | k | $b_{15}$ | k | $b_{15}$ | k | $b_{15}$ | k | $b_{15}$ |
| 2 | −0.001 | 2 | −0.002 | 2 | −0.002 | 2 | −0.003 | 2 | −0.002 |
| 3 | 0.0 | 3 | −0.001 | 3 | −0.002 | 3 | −0.003 | 3 | −0.002 |
| 4 | −0.002 | 4 | −0.001 | 4 | −0.002 | 4 | −0.002 | 4 | −0.002 |
| 6 | 0.0 | 6 | −0.001 | 6 | −0.002 | 6 | −0.003 | 6 | −0.002 |
| 8 | −0.001 | 8 | −0.002 | 8 | −0.003 | 8 | −0.003 | 8 | −0.002 |
| 10 | −0.001 | 10 | −0.002 | 10 | −0.003 | 10 | −0.003 | 10 | −0.003 |
| 16 | −0.003 | 16 | −0.003 | 16 | −0.004 | 16 | −0.004 | 16 | −0.004 |

TABLE 9

Variations of the Fourier-series coefficient $b_{17}$ with the parameters c and k.

| c = 0 | | c = 0.1 | | c = 0.25 | | c = 0.5 | | c = 1.0 | |
| --- | --- | --- | --- | --- | --- | --- | --- | --- | --- |
| k | $b_{17}$ | k | $b_{17}$ | k | $b_{17}$ | k | $b_{17}$ | k | $b_{17}$ |
| 2 | 0.0005 | 2 | 0.0 | 2 | −0.001 | 2 | −0.001 | 2 | 0.0 |
| 3 | 0.0003 | 3 | 0.0 | 3 | −0.001 | 3 | −0.001 | 3 | 0.0 |
| 4 | 0.0001 | 4 | 0.0 | 4 | −0.001 | 4 | −0.001 | 4 | 0.0 |
| 6 | 0.0 | 6 | −0.001 | 6 | −0.001 | 6 | −0.001 | 6 | 0.0 |
| 8 | 0.0 | 8 | −0.001 | 8 | −0.001 | 8 | −0.001 | 8 | 0.0 |
| 10 | 0.0003 | 10 | 0.0 | 10 | −0.001 | 10 | −0.001 | 10 | 0.0 |
| 16 | 0.0013 | 16 | 0.0007 | 16 | −0.001 | 16 | 0.0001 | 16 | 0.0 |

Finally, using the built-in mathematical functions in MATLAB, mathematical expressions of equations (4) and (5) are obtained for $b_m$, m=1, 2, ..., M as functions of parameters k and c. Table 10 shows the values of the parameters $\alpha_1$, $\alpha_2$, $\alpha_3$, $\alpha_4$, $\alpha_5$ and $\alpha_6$ for $b_m$, m=1, 3, 5, ..., 17.

TABLE 10

Values of the parameters $\alpha_i$, i = 1, 2, . . . , 6 of equations (4) and (5) for $b_m$, m = 1, 3, 5, . . . , 17.

|  | $\alpha_1$ | $\alpha_2$ | $\alpha_3$ | $\alpha_4$ | $\alpha_5$ | $\alpha_6$ |
|---|---|---|---|---|---|---|
| $b_1$ | 1.161 | −0.2254 | −0.2291 | 0.03305 | −0.4207 | 0.07906 |
| $b_3$ | 0.1353 | −0.2416 | −0.2034 | 0.05930 | 0.1705 | 0.07145 |
| $b_5$ | −0.05742 | −0.09218 | 0.2508 | 0.05028 | −0.1946 | −0.01559 |
| $b_7$ | −0.02289 | −0.04072 | 0.07088 | 0.03245 | −0.05016 | −0.02736 |
| $b_9$ | 0.007553 | −0.01424 | −0.01230 | 0.01433 | 0.004946 | −0.001660 |
| $b_{11}$ | −0.002431 | −0.007862 | 0.003087 | −0.003337 | −0.0009571 | 0.004486 |
| $b_{13}$ | 0.0002726 | −0.007618 | 0.001064 | 0.006429 | −0.0005725 | −0.0003962 |
| $b_{15}$ | −0.003039 | −0.009476 | 0.004478 | 0.007722 | −0.001549 | −9.891E−06 |
| $b_{17}$ | 1.347E−05 | −1.700E−05 | −2.849E−06 | 1.524E−05 | 8.029E−07 | 2.659E−07 |

Using equations (3)-(5), the output-voltage input-voltage characteristic of the class-AB bipolar SSPA is calculated and compared to the results obtained using equation (2). The results show that a very small value of the relative root-mean-square error (RRMSE)<0.66% can be achieved. This confirms the validity of equation (3) for the approximating the output-voltage input-voltage characteristic of the class-AB bipolar SSPA.

$$b_i = \alpha_1 + \alpha_2 c + \alpha_3 \frac{1}{k} + \alpha_4 c^2 + \alpha_5 \frac{1}{k^2} + \alpha_6 \frac{c}{k}, \quad i = 1, 3, 5, 7 \quad (4)$$

$$b_i = \alpha_1 + \alpha_2 c + \alpha_3 \ln(k) + \alpha_4 c^2 + \alpha_5 \ln(k)^2 \alpha_6 c \cdot \ln(k), i = 9, 11, \ldots, 17 \quad (5)$$

Regarding third-order intermodulation products, equation (3) can be used for predicting the amplitudes of the third-order intermodulation components of the output voltage resulting from a multi-sinusoidal input voltage. Thus, x(t) can be expressed as, $$x(t) = \sum_{k=1}^{K} V_k \sin\omega_k t, \quad (6)$$

where $\omega_k$ and $V_k$ represent the frequency and normalized-amplitude of the kth sinusoid respectively. Combining equations (3) and (6) and using the trigonometric identities $$\sin(\beta\sin\theta) = 2\sum_{l=0}^{\infty} J_{2l+1}(\beta)\sin(2l+1)\theta$$

and $$\cos(\beta\sin\theta) = J_0(\beta) + 2\sum_{l=1}^{\infty} J_{2l}(\beta)\cos(2l)\theta$$

where $J_l(\beta)$ is the Bessel function of order l, and after simple mathematical manipulations, it is shown that the normalized-amplitude of the output-voltage component of frequency $$\sum_{k=1}^{K} \alpha_k \omega_k$$

and order $$\sum_{k=1}^{K} |\alpha_k|,$$

where $\alpha_k$ is a positive or negative integer or zero, will be given by $$V_{\alpha_1,\alpha_2,\ldots,\alpha_K} = 2\sum_{m=1}^{M} b_m \prod_{k=1}^{K} J_{|\alpha_k|}\left(\frac{2m\pi}{D}V_k\right), \text{ for } \sum_{k=1}^{K} |\alpha_k| = \text{odd integer.} \quad (7)$$

Using equation (7), the normalized-amplitude of the output-voltage component of frequency $\omega_r$, r=1, 2, . . . , K, can be expressed as, $$V_{1,0,0,0,\ldots} = 2\sum_{m=1}^{M} b_m J_1\left(\frac{2m\pi}{D}V_r\right) \prod_{\substack{k=1 \\ k\neq r}}^{K} J_0\left(\frac{2m\pi}{D}V_k\right). \quad (8)$$

The normalized-amplitude of the intermodulation product of frequency $q\omega_r \pm p\omega_s$, and order p+q=odd integer, of the output-voltage can be expressed as $$V_{q,p,0,0,0,\ldots} = 2\sum_{m=1}^{M} b_m J_q\left(\frac{2m\pi}{D}V_r\right) J_p\left(\frac{2m\pi}{D}V_s\right) \prod_{\substack{k=1 \\ k\neq r,s}}^{K} J_0\left(\frac{2m\pi}{D}V_k\right). \quad (9)$$

In a similar way the normalized-amplitude of any intermodulation component of any odd order can be obtained using equation (7).

Regarding two-tone testing, the use of equations (8) and (9) is illustrated by considering the two-tone equal-amplitude input case widely used in characterizing RF communication systems and components. In this case the input voltage comprises two equal-amplitude sinusoids. Thus, x(t) can be expressed using equation (6) with K=2 and $V_1=V_2=V$ and equations (8) and (9) reduce to, $$V_{1,0} = 2\sum_{m=1}^{M} b_m J_1\left(\frac{2m\pi}{D}V\right) J_0\left(\frac{2m\pi}{D}V\right) \quad (10)$$

$$V_{2,1} = 2\sum_{m=1}^{M} b_m J_2\left(\frac{2m\pi}{D}V\right) J_1\left(\frac{2m\pi}{D}V\right) \quad (11)$$

$$V_{3,2} = 2\sum_{m=1}^{M} b_m J_3\left(\frac{2m\pi}{D}V\right) J_2\left(\frac{2m\pi}{D}V\right) \quad (12)$$

Combining equations (10)-(12), the relative third- and fifth-order intermodulation can be expressed as, $$IM_3 = \frac{V_{2,1}}{V_{1,0}}, \quad (13)$$

$$IM_5 = \frac{V_{3,2}}{V_{1,0}}. \quad (14)$$

Figure 7:
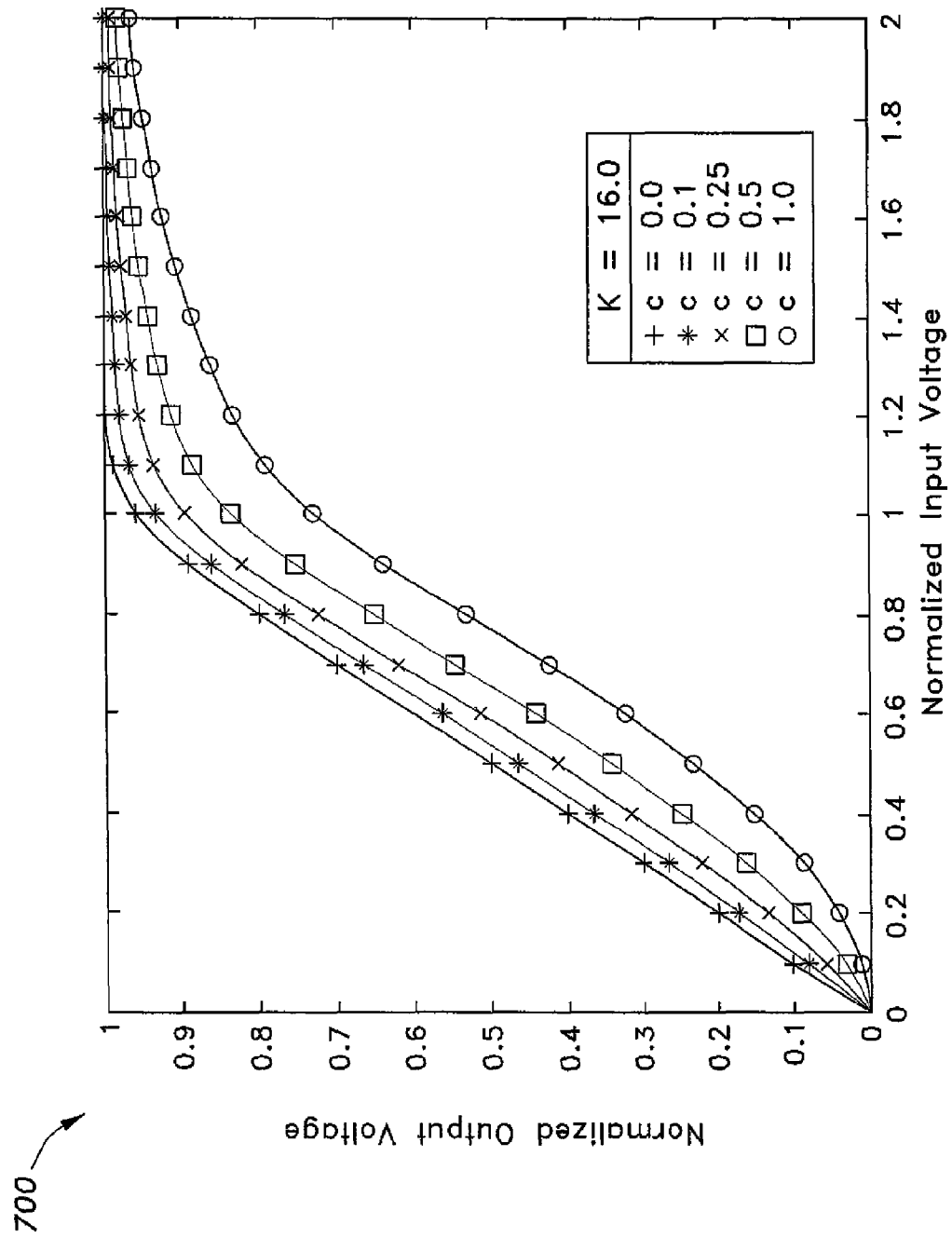
FIG. 7 is a plot showing normalized voltage I/O of a power amplifier with a compression characteristic sharpness parameter, $k=16$ and a varying set of weak conduction non-linearity constants.
Figure 8:
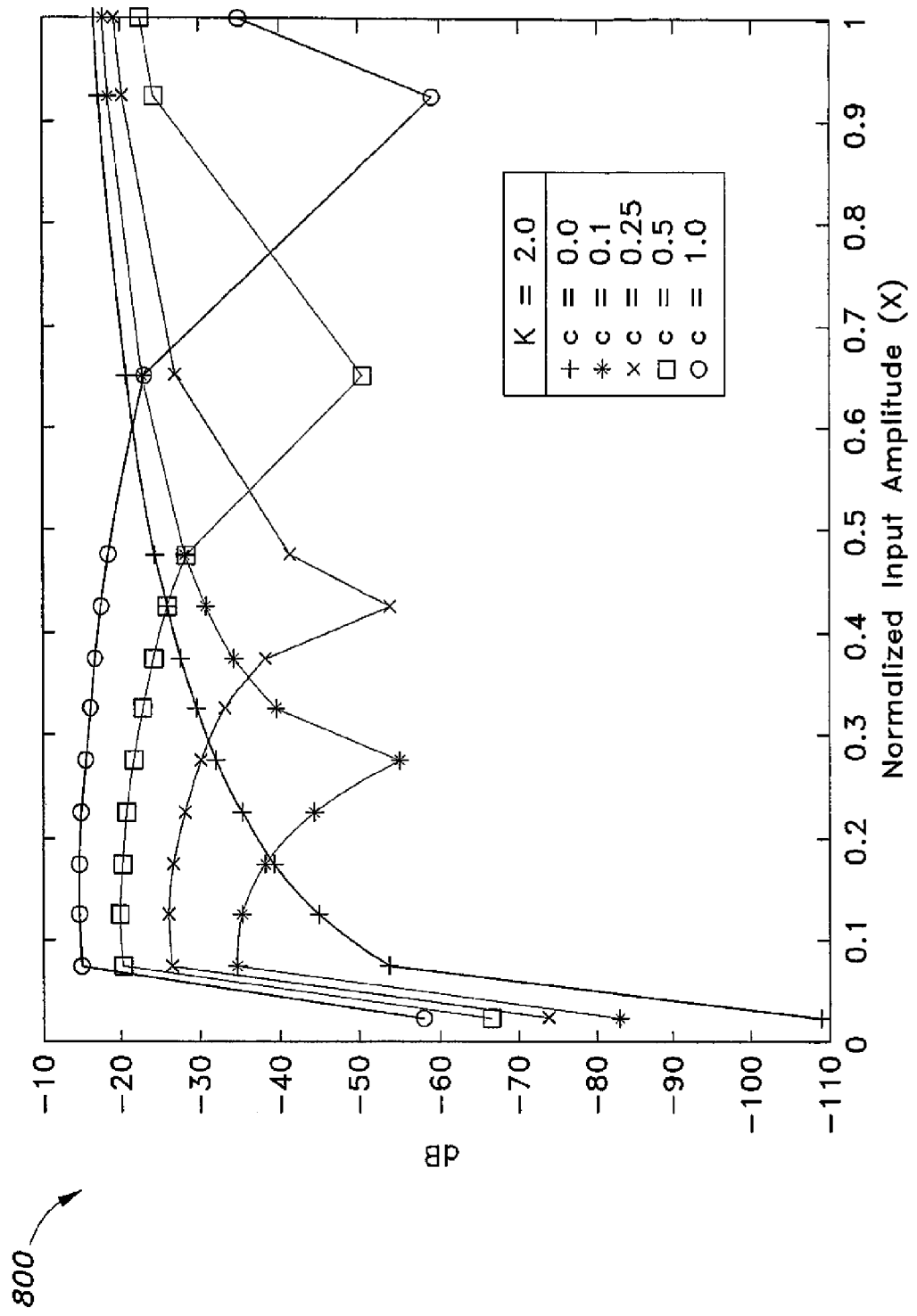
FIG. 8 is a plot showing relative third order IMD performance of a power amplifier with a compression characteristic sharpness parameter, $k=2$ and a varying set of weak conduction non-linearity constants.
Figure 9:
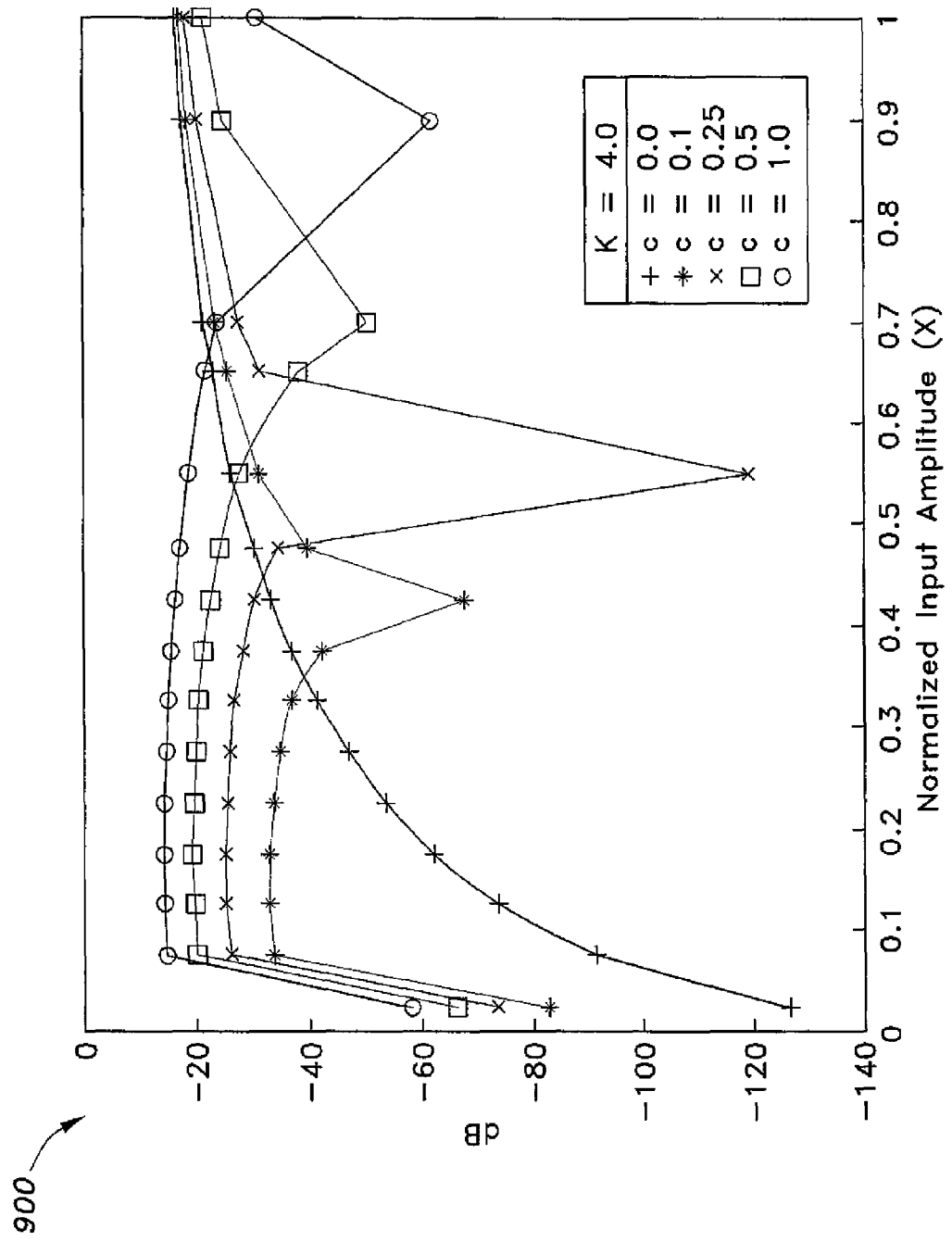
FIG. 9 is a plot showing relative third order IMD performance of a power amplifier with a compression characteristic sharpness parameter, $k=4$ and a varying set of weak conduction non-linearity constants.
Figure 10:
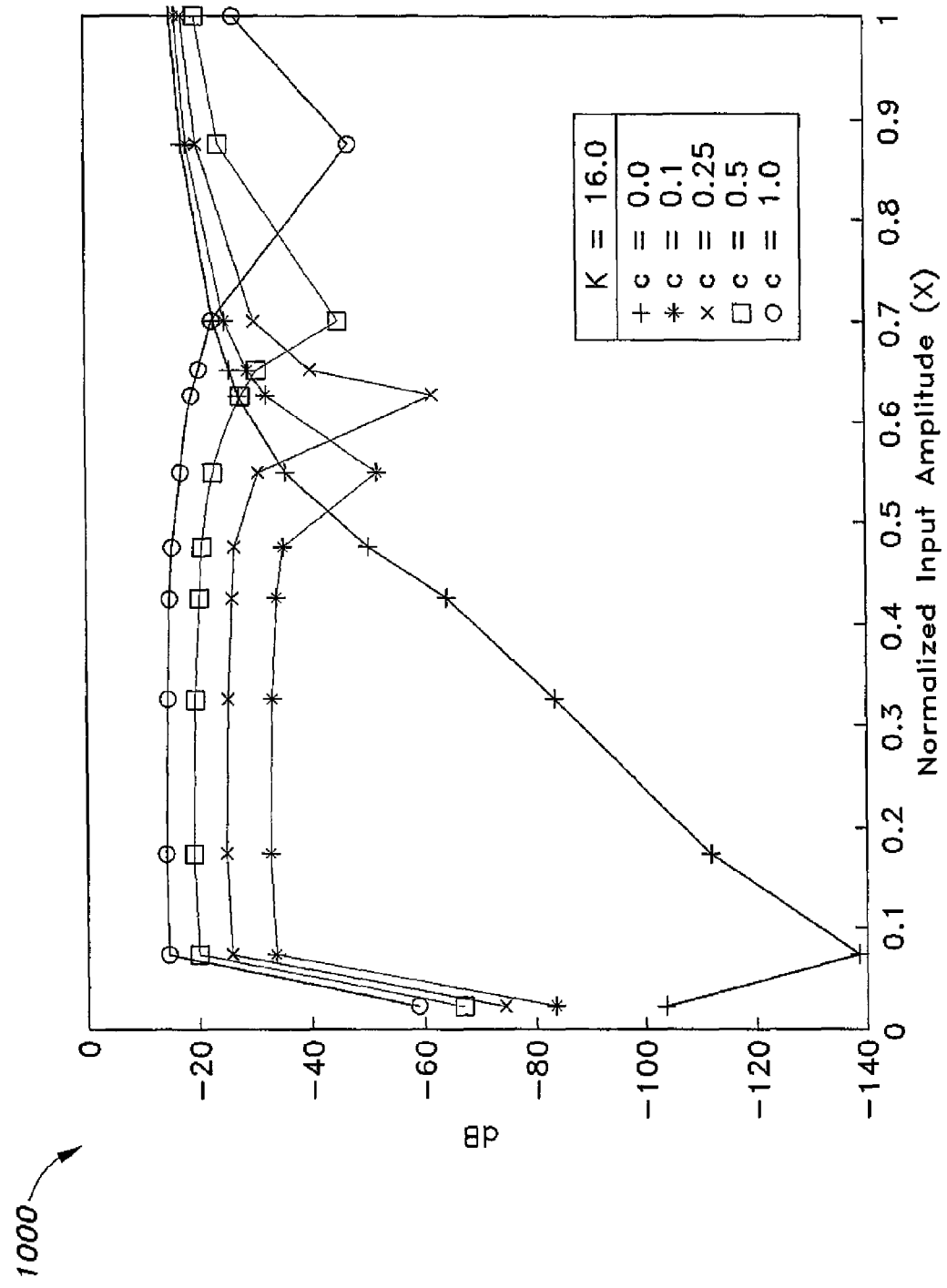
FIG. 10 is a plot showing relative third order IMD performance of a power amplifier with a compression characteristic sharpness parameter, $k=16$ and a varying set of weak conduction non-linearity constants.
Figure 11:
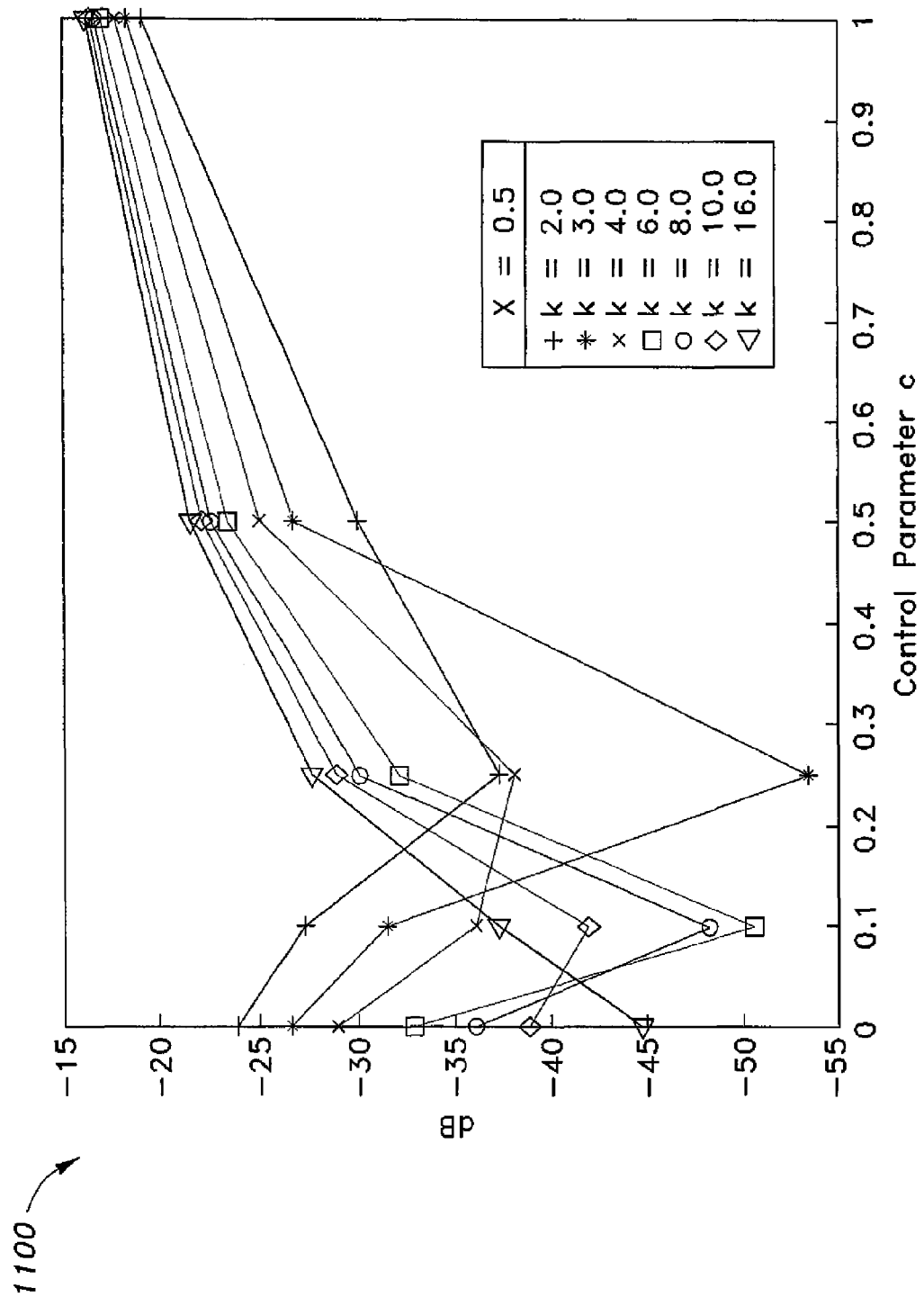
FIG. 11 is a plot showing relative third order IMD performance of a power amplifier with a control parameter c for $X=0.5$ and a varying set of compression characteristic sharpness parameters, k.
Figure 12:
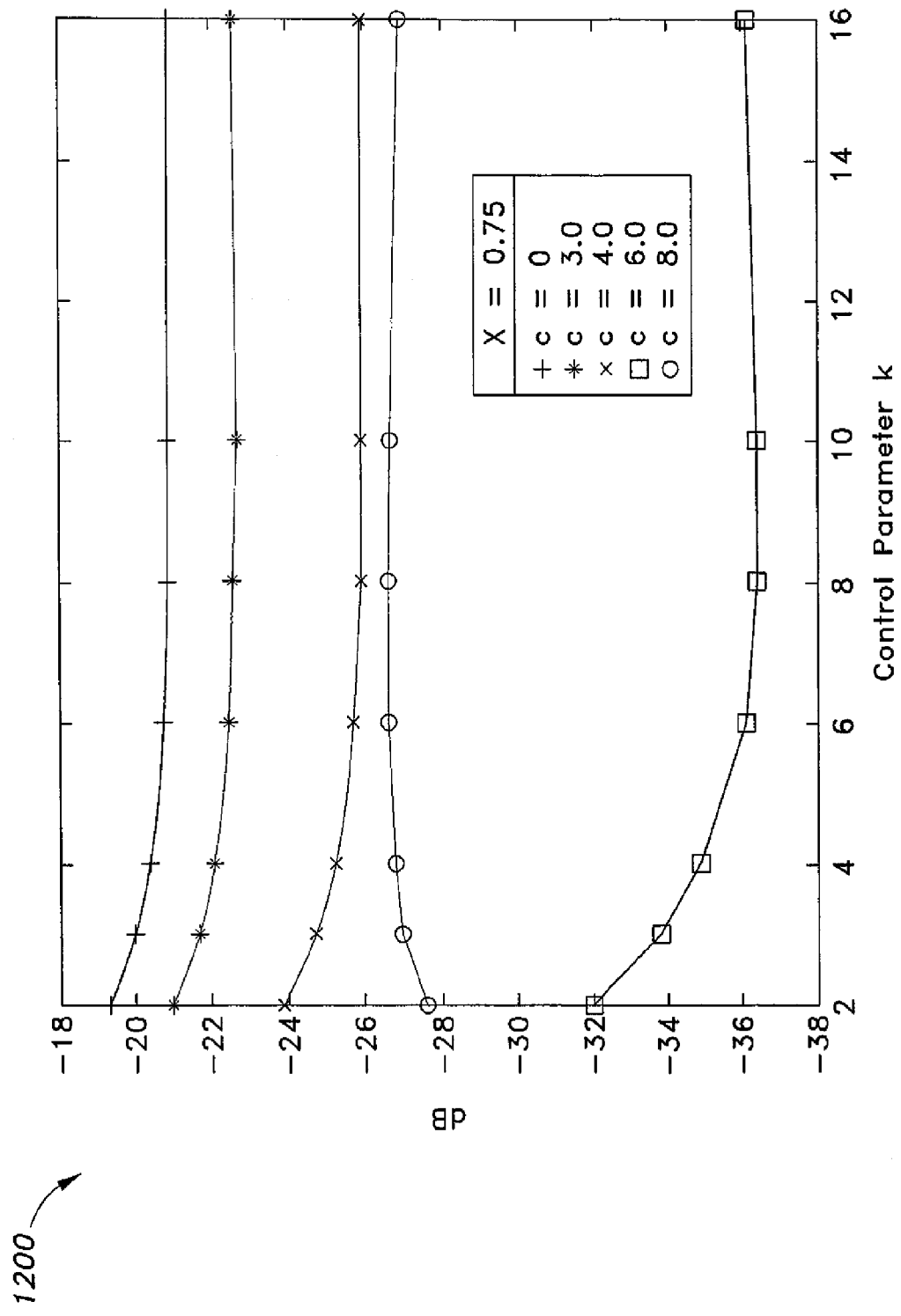
FIG. 12 is a plot showing relative third order IMD performance of a power amplifier with a control parameter k for $X=0.75$ and a varying set of weak conduction non-linearity constants, c.

Using equations (13) and (14), the third-order and fifth-order intermodulation performance of the class-AB bipolar SSPA was calculated and the results are shown in plots 800 through 1000 of FIGS. 8-10, respectively for the third-order intermodulation only. Inspection of plots 800 through 1000 of FIGS. 8-10, respectively, clearly shows that for c=0, the relative third-order intermodulation is very low for small values of the normalized input voltage amplitude. However, this is not the case when c≠0 where the relative intermodulation is relatively high for small relative input voltage amplitudes. For example, from plot 900 of FIG. 9, with k=4.0 and X=0.1, the relative third-order intermodulation is −90.0 dB for c=0 and increases to −17.0 dB for c=1. Simultaneous inspection of the plots of FIGS. 5 and 8 clearly shows that, for k=2.0 and c=0, the relative third-order intermodulation is increasing monotonically with the normalized amplitude of the input voltage. However, for the same value of k=2.0, the relative third-order intermodulation exhibit minima for values of c=0.1, 0.25, 0.5 and 1.0. This is in good agreement with the simulated and measured results reported in the prior art. This implies that the introduction of the term (tan h(x))' into equation (2) would result in a concave- and a convex-like nonlinearities that may lead to the partial cancellation of the nonlinearity and whence the third-order intermodulation at particular amplitudes of the input two-tone signal. This can be confirmed from the plots of FIGS. 5-7 where it is clear that with c≠0, the normalized input-voltage output-voltage characteristics starts with a concave characteristics and ends with a convex characteristic before entering into the saturation region. A similar pattern of performance is observed by simultaneous inspection of FIGS. 6 and 9 for k=4.0, and FIGS. 7 and 10 for k=16.0. Inspection of plots 800 through 1000 of FIGS. 8-10, respectively shows also that as the value of the parameter c increases, the relative third-order intermodulation increases and the values of the normalized input voltage at which the third-order intermodulation exhibits a minima increase and move towards the saturation region. This is further investigated in plot 1100 of FIG. 11 and plot 1200 of FIG. 12. Inspection of the plot of FIG. 11 shows that for X=0.5 and different values of the parameter k, the relative third-order intermodulation increases as the parameter c increases and exhibits minima at different values of c for different values of k. Inspection of the plot of FIG. 12 shows that for X=0.75 and different values of the parameter c, the relative third-order intermodulation changes slightly as the parameter k increases and exhibits no minima. This confirms that it is the parameter c that introduces a linear region in the transfer function leading to partial nullification of the relative third-order intermodulation.

Regarding predistortion network synthesis, resistor-diode based function generators are commonly used for linearizing the characteristics of power amplifiers; class-AB bipolar SSPAs are not exceptions. This can be achieved by inserting a predistortion network before the class-AB bipolar SSPA. This predistortion network is expected to generate intermodulation products of the same magnitude but opposite polarity to those generated by the class-AB bipolar SSPA. A variable gain voltage amplifier 104 may be included immediately after the predistortion network 102 to help in adjusting the voltage levels, thus, cancellation of the intermodulation products generated by the class-AB bipolar SSPA 106 can be achieved using the predistortion system 100 of FIG. 1.

Traditionally, the inverse characteristic of the SSPA is obtained and a set of break points on this characteristic is selected. The diodes used in these circuits are modeled either by the exponential current-voltage relationship or by the simple straight-line approximation. Using the selected break points and diode models, the values of the resistors involved in the predistortion network can be calculated. Alternatively, the break points of the predistortion network input-output characteristic can be directly obtained from the two-tone intermodulation test of the class-AB bipolar SSPA. This avoids the need to measure the input-output characteristic of the class-AB bipolar SSPA and then inverting it. However, it requires measurement of the two-tone intermodulation performance of the class-AB bipolar SSPA. This approach is cumbersome, as it requires repeating the process for each power input especially if the back-off ratio of the class-AB bipolar SSPA is changed.

Regarding the method for deciding the break points of the diode-resistor based predistortion network nonlinear input-output characteristic without recourse to inverting the input-output characteristic of the class-AB bipolar SSPA or measurement of the intermodulation performance of the class-AB bipolar SSPA, the break points are obtained directly from the database of the class-AB bipolar SSPA intermodulation performance obtained from the calculations made supra. The target is to find the break points of the diode-resistor based predistortion network nonlinear input-output characteristic to meet a given set of output intermodulation products; usually of equal amplitude and opposite phase to the intermodulation products generated by the class-AB bipolar SSPA.

Figure 2:
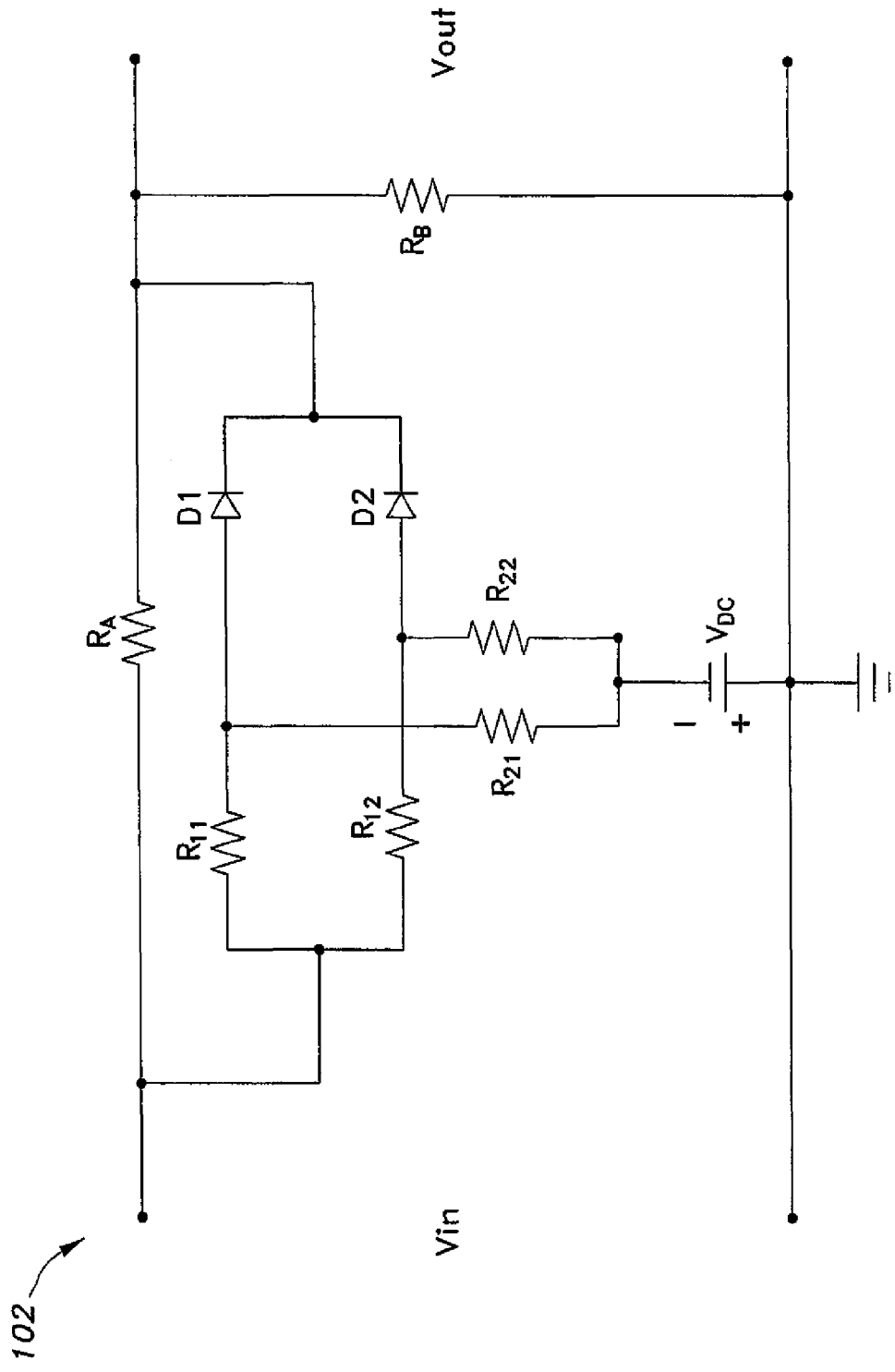
FIG. 2 is a circuit diagram of the predistortion circuit with concave characteristic according to the present invention.
Figure 5:
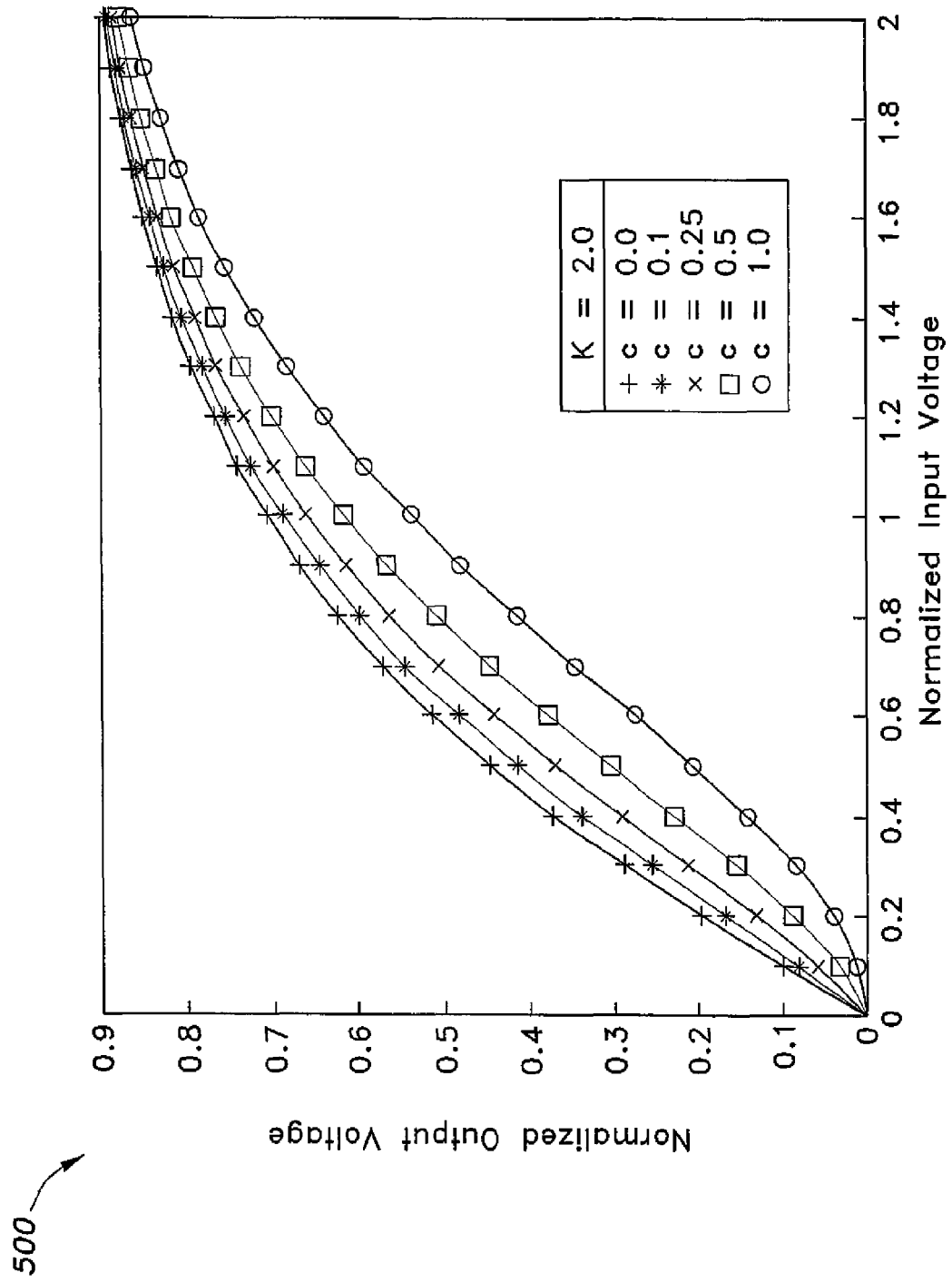
FIG. 5 is a plot showing normalized voltage I/O of a power amplifier with a compression characteristic sharpness parameter, $k=2$ and a varying set of weak conduction non-linearity constants.
Figure 6:
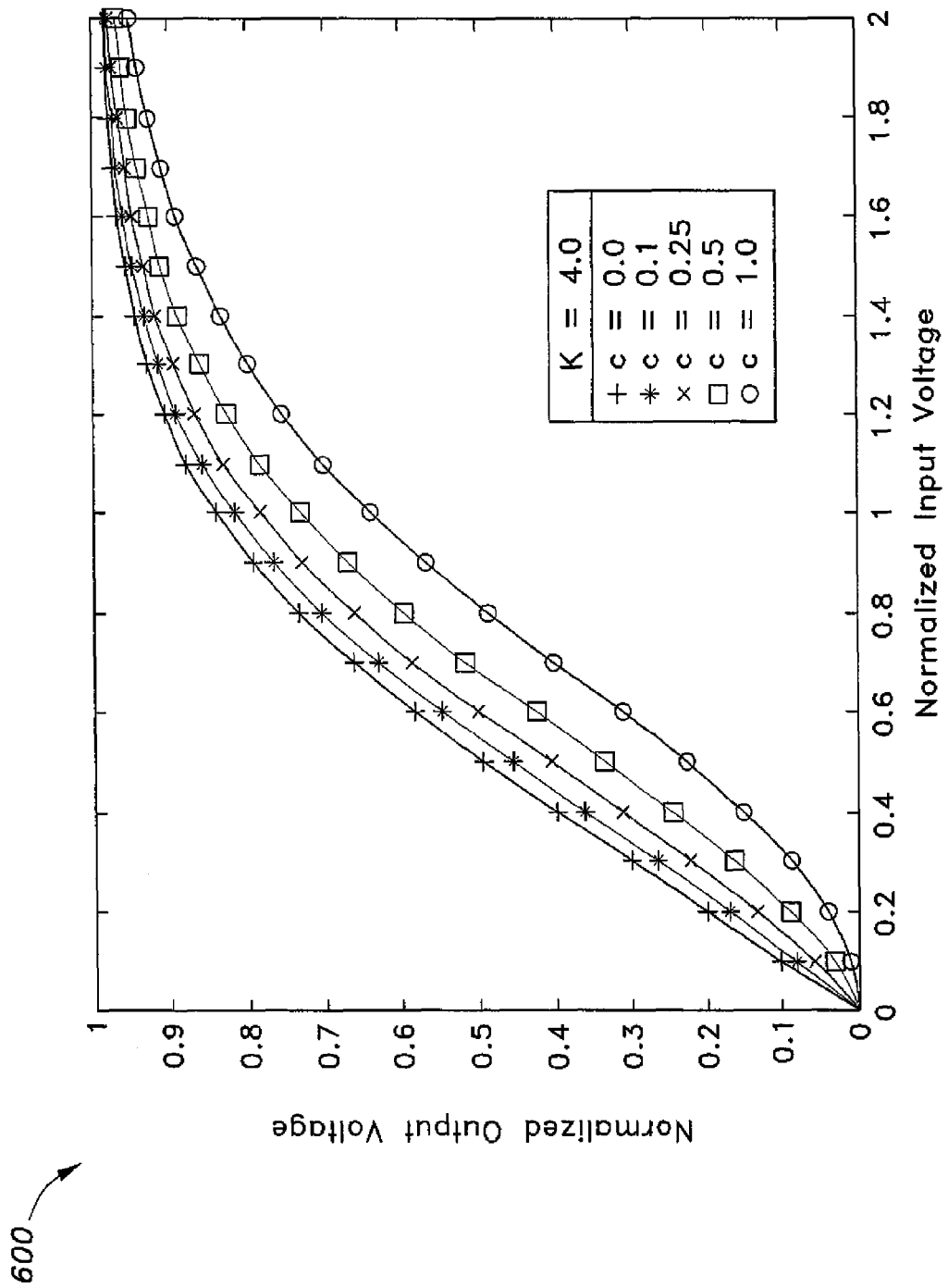
FIG. 6 is a plot showing normalized voltage I/O of a power amplifier with a compression characteristic sharpness parameter, $k=4$ and a varying set of weak conduction non-linearity constants.

Referring to the plots of FIGS. 5-7 it is observed that the input-output nonlinear characteristic of the class-AB bipolar SSPA is convex. Thus, the input-output characteristic of a predistortion network that would produce intermodulation products of same magnitude and opposite polarity to those produced by the class-AB bipolar SSPA should be concave as shown in plot 1300 of FIG. 13. Network 102 of FIG. 2 shows a possible realization for a diode-resistor circuit used to obtain the nonlinear concave input-output characteristic of plot 1300 in FIG. 13. Assuming that the characteristic of FIG. 13 can be represented by a fifth-order polynomial of the form, $$V_{out} = AV_{in} + BV_{in}^3 + CV_{in}^{5n}, \quad (15)$$

where A is a positive quantity and B and C are positive or negative quantities. Under the standard two-tone test, with $$V_{in}(t) = X(\cos \omega_1 t + \cos \omega_2 t), \quad (16)$$

the output can be expressed as $$Vout(t) = X(A + 9/4BX2 + 25/4CX4)\cos \omega_1 t + \ldots + X^3/4$$
$$(3B + 25/2CX^2)\cos(2\omega_1 - \omega 2)t + \ldots + 5/8CX^5 \cos$$
$$(3\omega_1 - 2\omega^2)t + \ldots \quad (17)$$

Hence the amplitude of the output signal with frequency $f_1 = \omega_1/2\pi$ (or $f_2 = \omega_2/2\pi$) is, $$S_1 = X(A + 9/4BX^2 + 25/4CX^4) \quad (18)$$

and the amplitude of the output intermodulation product with frequency $2f_1 - f_2 = (2\omega_1 - \omega_2)/2\pi$ (or $2f_2 - f_1 = (2\omega_2 - \omega_1)/2\pi$) is $$S_{21} = \frac{X^3}{4}\left(3B + \frac{25}{2}CX^2\right) \quad (19)$$

while the amplitude of the output intermodulation product with frequency $3f_1 - 2f_2 = (3\omega_1 - 2\omega_2)/2\pi$ (or $3f_2 - 2f_1 = (3\omega_2 - 2\omega_1)/2\pi$) is $$S_{32} = 5/8CX^5. \quad (20)$$

Figure 13:
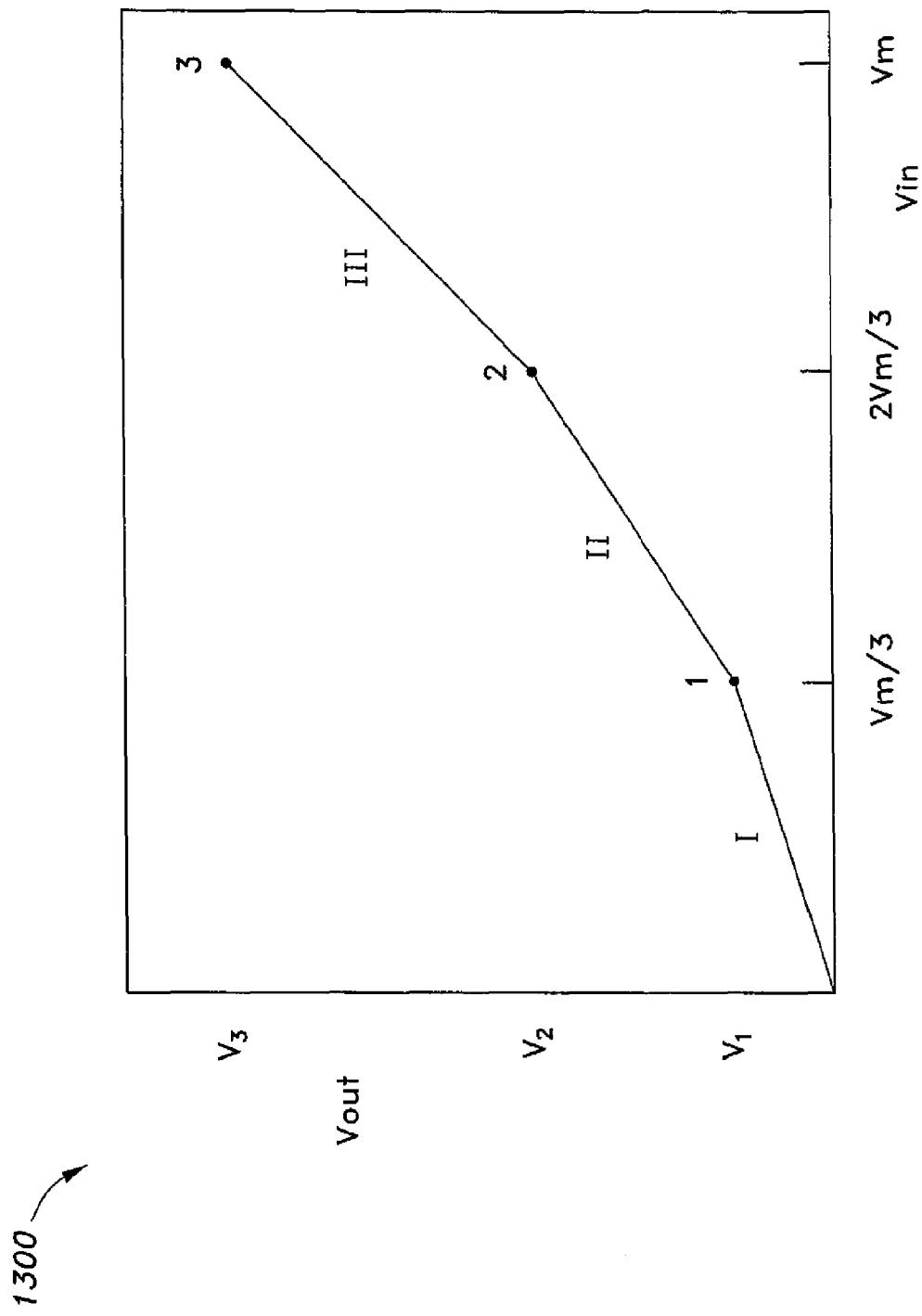
FIG. 13 is a plot showing monotonically increasing concave characteristic of the predistorter.

Now, if the input-output characteristic of the predistortion network can be represented using plot 1300 of FIG. 13, then the parameters A, B and C can be obtained by solving the following three equations, $$V_1 = \frac{V_m}{3}\left(A + \left(\frac{V_m}{3}\right)^2 B + \left(\frac{V_m}{3}\right)^4 C\right), \quad (21)$$

$$V_2 = \frac{2V_m}{3}\left(A + \left(\frac{2V_m}{3}\right)^2 B + \left(\frac{2V_m}{3}\right)^4 C\right), \quad (22)$$

and, $$V_3 = V_m(A + V_m^2 B + V_m^4 C). \quad (23)$$

giving $$A = \frac{45V_1 - 9V_2 + V_3}{10V_m}. \quad (24)$$

$$B = \frac{9}{8V_m^3}(-13V_1 + 8V_2 - V_3). \quad (25)$$

$$C = \frac{81}{40V_m^5}(5V_1 - 4V_2 + V_3). \quad (26)$$

Substituting into equations (18)-(20) yields, $$S_1 = \left(\frac{45V_1 - 9V_2 + V_3}{10V_m}\right)X + \frac{81}{32V_m^3}(-13V_1 + 8V_2 - V_3)X^3 + \frac{405}{32V_m^5}(5V_1 - 4V_2 + V_3)X \quad (27)$$

$$S_{21} = \frac{27}{32V_m^3}(-13V_1 + 8V_2 - V_3)X^3 + \frac{405}{64V_m^5}(5V_1 - 4V_2 + V_3) + X^5 \quad (28)$$

$$S_{32} = \frac{81}{64V_m^5}(5V_1 - 4V_2 + V_3)X^5. \quad (29)$$

Assuming that the two-tone test is performed under $-\beta$ backoff, then, $$-\beta = 10\log_{10}\frac{2X^2/2}{V_m^2/2} \quad (30)$$

giving, $$X = \frac{V_m}{\sqrt{2}}\gamma. \quad (31)$$

where, $$\gamma = 10^{-\beta/10}. \quad (32)$$

Substituting equation (31) into equations (27)-(29) yields, $$S_1 = \frac{9}{2\sqrt{2}}\gamma\left(1 - \frac{117}{32}\gamma^2 + \frac{450}{128}\gamma^4\right)V_1 + \quad (33)$$

$$\frac{9}{2\sqrt{2}}\gamma\left(-\frac{1}{5} + \frac{9}{4}\gamma^2 - \frac{45}{16}\gamma^4\right)V_2 \frac{1}{2\sqrt{2}}\gamma\left(\frac{1}{5} - \frac{81}{32}\gamma^2 + \frac{405}{64}\gamma^4\right)V_3$$

$$S_{21} = \frac{27}{64\sqrt{2}}\gamma^3\left(-13 + \frac{75}{4}\gamma^2\right)V_1 + \quad (34)$$

$$\frac{27}{8\sqrt{2}}\gamma^3\left(1 - \frac{15}{8}\gamma^2\right)V_2 \frac{27}{64\sqrt{2}}\gamma^3\left(-1 + \frac{15}{4}\gamma^2\right)V_3$$

$$S_{32} = \frac{405}{256\sqrt{2}}\gamma^5\left(-13 + \frac{75}{4}\gamma^2\right)V_1 - \frac{81}{64\sqrt{2}}\gamma^5 V_2 + \frac{81}{256\sqrt{2}}\gamma^5 V_3. \quad (35)$$

Figure 3:
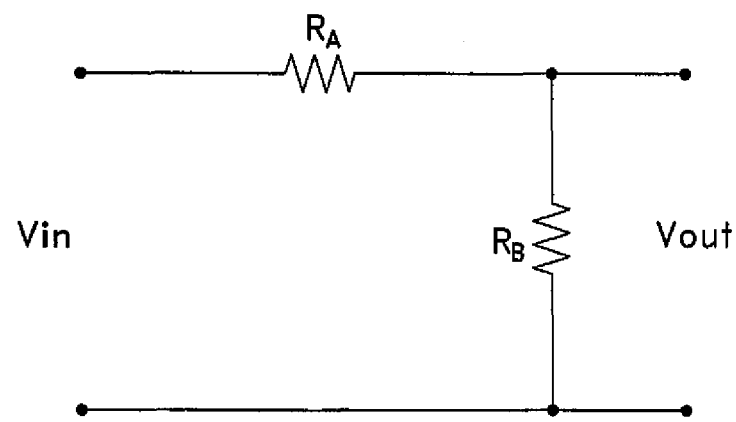
FIG. 3 is a circuit diagram of the predistortion circuit showing circuit path with all diodes non-conducting, according to the present invention.

Solving equations (33)-(35) yields the required values of $V_1$, $V_2$ and $V_3$. Thus, using the three break points $(V_m/3, V_1)$, $(2V_m/3, V_1)$ and $(V_m, V_1)$ the diode-resistor linearizer circuit of FIG. 2 can be designed and the required values of the resistors can be obtained using the procedure described below.

a. In Region I:

No diodes are conducting and assuming that the source resistance is sufficiently small, the circuit 102 of FIG. 2 reduces to the circuit 300 of FIG. 3. The relation between $R_A$ and $R_B$ for realizing point 1 of plot 1300 in FIG. 13 should be $$V_1 = \frac{V_m}{3}\frac{R_B}{R_A + R_B}. \quad (36)$$

Figure 4:
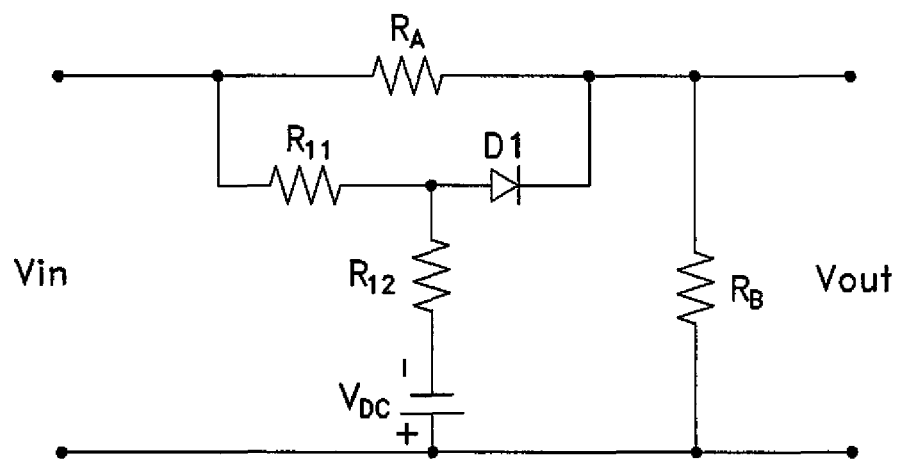
FIG. 4 is a circuit diagram of the predistortion circuit showing circuit path with a single diode conducting, according to the present invention.

The value of $R_A + R_B = R_T$ will define the arbitrary impedance level of the circuit, and once a choice of $R_T$ is made then values of $R_A$ and $R_B$ can be calculated using values of $V_m/3$ and $V_1$ obtained from FIG. 13.

b. In Region II:

Only diode $D_1$ is conducting and with the source resistance sufficiently small, the circuit 102 of FIG. 2 reduces to the circuit 400 of FIG. 4. The equations governing the operation of the circuit of FIG. 4 are $$\frac{(V_m/3) + V_{DC}}{R_{11} + R_{21}}R_{21} - V_{DC} = V_1 \quad (37)$$

(condition for diode $D_1$ to conduct)

$$\frac{(2V_m/3) - V_2}{R_A} + I_{D1} = \frac{V_2}{R_B} \quad (38)$$

$$I_{D1} = I_0(\exp(V_{D1}/\eta V_T) - 1) \quad (39)$$

$$I_{D1} = \frac{(2V_m/3) - (V_{D1} + V_2)}{R_{11}} - \frac{V_{DC} + (V_{D1} + V_2)}{R_{21}}. \quad (40)$$

Equation (39) is the diode equation where $V_T$ is the thermal voltage and the constants $I_0$ and $\eta$ can be found experimentally. Simultaneous solution of equations (37)-(40) yields the values of $R_{11}$ and $R_{21}$ assuming a suitable value for the DC supply voltage $V_{DC}$.

c. In Region III:

Diodes $D_1$ and $D_2$ are conducting and circuit is in its original form of circuit 102 in FIG. 2. The equations governing the operation of the circuit of FIG. 2 are $$\frac{(2V_m/3) + V_{DC}}{R_{12} + R_{22}} R_{22} - V_{DC} = V_{22} \tag{41}$$

(condition for diode $D_2$ to conduct)

$$\frac{V_m - V_3}{R_A} + I_{D1} + I_{D2} = \frac{V_3}{R_B} \tag{42}$$

$$I_{D1} = I_0(\exp(V_{D1}/\eta V_T) - 1) \tag{43}$$

$$I_{D2} = I_0(\exp(V_{D2}/\eta V_T) - 1) \tag{44}$$

$$I_{D1} = \frac{V_m - (V_{D1} + V_3)}{R_{11}} - \frac{V_{DC} + (V_{D1} + V_3)}{R_{21}} \tag{45}$$

$$I_{D2} = \frac{V_m - (V_{D1} + V_3)}{R_{12}} - \frac{V_{DC} + (V_{D1} + V_3)}{R_{22}}, \tag{46}$$

Simultaneous solution of equations (41)-(46) yields the values of $R_{12}$ and $R_{22}$, and completes the design of the linearizer circuit.

A careful choice of the DC supply voltage, $V_{DC}$, and the total resistance, $R_T$, will avoid the generation of negative values for the resistances. Moreover, although the circuit analyzed here is built around two diodes and requires three break points, its extension to cover more break points, and thus larger number of diodes, is simple and straightforward. The exemplary predistortion circuit with concave characteristic is designed using the data obtained from a new functional model for the class-AB bipolar SSPA widely used in wireless communication systems. Using this model, closed-form expressions for the intermodulation performance of the class-AB bipolar SSPA excited by a multi-sinusoidal signal have been obtained. Using the present model the effect of the parameters k and c of the widely used Cann model has been studied in detail. The special case of a two-tone equal-amplitude exciting signal has been considered in detail. The results show that the parameter c plays an important role in introducing sweet points; where minimum relative third-order intermodulation can be achieved, in the class-AB bipolar SSPA characteristic. Using the proposed analysis it is possible to build a database for the variation of the relative third-order intermodulation as a function of the class-AB bipolar SSPA parameters.

This database is helpful for the designers to optimize the operation of the class-AB bipolar SSPA by selecting parameters that lead to the minimum possible third-order intermodulation for a given scenario of the input amplitudes. Moreover, this database can be used for developing a predistortion network that generates intermodulation products of equal magnitude and opposite phase to that produced by the class-AB SSPA. Such a predistortion network can be used for linearizing the input-output characteristic of the class-AB bipolar SSPA.

The procedure described here is not limited to the class-AB bipolar SSPA and can be used for designing a predistortion network for any amplifier once its mathematical model and consequently its third-order and fifth-order two-tone intermodulation performance is calculated.

It is to be understood that the present invention is not limited to the embodiments described above, but encompasses any and all embodiments within the scope of the following claims.

We claim:

1. A predistortion circuit with concave characteristic, comprising:
   an amplifier, and
   a passive network connected to the amplifier, the passive network having a plurality of breakpoints determined from a database containing database values that memorialize variation of relative third-order intermodulation as a function of the amplifier's input/output (I/O) characteristics where the input is comprised of multi-sinusoidal waveforms, the multi-sinusoidal waveforms consisting of a two-tone equal-amplitude input, the passive network substantially cancelling out third order IMD of the amplifier thereby resulting in a linearized I/O characteristic of the amplifier, where the database values are a function of an amplifier model having a transfer function characterized by the Fourier sine-series relation, $$y = \sum_{m=1}^{M} b_m \sin\left(\frac{2m\pi}{D} x\right),$$

where y is a normalized output voltage, x is a normalized input voltage, D is a complete period of a periodic function, and $b_m$, where m=1, 2, . . . , M for a maximum integer value M, are obtained fitting parameters which provide a best fit between a measured input/output characteristic and the Fourier sine-series relation, wherein the concave characteristic of the predistortion circuit is represented by a fifth order polynomial characterized by the relation $$V_{out} = AV_{in} + BV_{in}^3 + CV_{in}^5,$$

with the two-tone equal-amplitude input being characterized by the relation $V_{in}(t) = X(\cos \omega_1 t + \cos \omega_2 t)$, and the predistortion circuit output being characterized by the relation $$V_{out}(t) = X\left(A + \frac{9}{4}BX^2 + \frac{25}{4}CX^4\right)\cos\omega_1 t + \ldots +$$
$$\frac{X^3}{4}\left(3B + \frac{25}{2}CX^2\right)\cos(2\omega_1 - \omega_2)t + \ldots + \frac{5}{8}CX^5\cos(3\omega_1 - 2\omega_2)t + \ldots ,$$

where, $$A = \frac{45V_1 - 9V_2 + V_3}{10V_m},$$

$$B = \frac{9}{8V_m^3}(-13V_1 + 8V_2 - V_3), \text{ and}$$

$$C = \frac{81}{40V_m^5}(5V_1 - 4V_2 + V_3),$$

where the amplitude of the output signal with frequency $f_1 = \omega_1/2\pi$ or $f_2 = \omega_2/2\pi$ is characterized by the relation $$S_1 = X(A + 9/4BX^2 + 25/4CX^4),$$

and the amplitude of the output intermodulation product with frequency $2f_1-f_2=(2\omega_1-\omega_2)/2\pi$ or $2f_2-f_1=(2\omega_2-\omega_1)/2\pi$ is characterized by the relation $$S_{21} = \frac{X^3}{4}\left(3B + \frac{25}{2}CX^2\right)$$

and the amplitude of the output intermodulation product with frequency $3f_1-2f_2=(3\omega_1-2\omega_2)/2\pi$ or $3f_2-2f_1=(3\omega_2-2\omega_1)/2\pi$ is characterized by the relation $S_{32}=5/8CX^5$, and the maximum output is characterized by the relation $$-\beta = 10\log_{10}\frac{2X^2/2}{V_m^2/2},$$

the amplitude of a single input tone X being characterized by the relation $$X = \frac{V_m}{\sqrt{2}}\gamma,$$

where $\gamma=10^{-\beta/10}$, and the output intermodulation product amplitudes are further characterized by relations $$S_1 = \frac{9}{2\sqrt{2}}\gamma\left(1 - \frac{117}{32}\gamma^2 + \frac{450}{128}\gamma^4\right)V_1 +$$
$$\frac{9}{2\sqrt{2}}\gamma\left(-\frac{1}{5} + \frac{9}{4}\gamma^2 - \frac{45}{16}\gamma^4\right)V_2 + \frac{1}{2\sqrt{2}}\gamma\left(\frac{1}{5} - \frac{81}{32}\gamma^2 + \frac{405}{64}\gamma^4\right)V_3,$$

$$S_{21} = \frac{27}{64\sqrt{2}}\gamma^3\left(-13 + \frac{75}{4}\gamma^2\right)V_1 +$$
$$\frac{27}{8\sqrt{2}}\gamma^3\left(1 - \frac{15}{8}\gamma^2\right)V_2 \frac{27}{64\sqrt{2}}\gamma^3\left(-1 + \frac{15}{4}\gamma^2\right)V_3, \text{ and}$$

$$S_{32} = \frac{405}{256\sqrt{2}}\gamma^5\left(-13 + \frac{75}{4}\gamma^2\right)V_1 - \frac{81}{64\sqrt{2}}\gamma^5 V_2 + \frac{81}{256\sqrt{2}}\gamma^5 V_3,$$

wherein the concave characteristic of the predistortion circuit has three break points, $(V_m/3,V_1)$, $2V_m/3,V_1)$ and $(V_m,V_1)$ dividing the concave characteristic into first second, and third regions, respectively, and wherein the passive network comprises:
a top rail and a bottom rail;
a resistor $R_A$ connected in series with the top rail;
a resistor $R_B$ connected across the top and bottom rail at an output $V_{out}$ of the passive network;
a resistor-diode loop comprised of a first series connected resistor-diode pair $R_{11}$, $D_1$ in parallel with a second series connected resistor-diode pair $R_{12}$, $D_2$, the resistor-diode loop being connected in parallel with resistor $R_A$, diode end of the resistor-diode loop connected at the Vout end of the top rail and resistor end of the resistor-diode loop being connected at a Vin end of the top rail;
a biasing voltage supply $V_{DC}$ having a positive terminal connected to ground and the bottom rail, the biasing voltage supply also having a negative terminal;
a first biasing resistor $R_{21}$ connected to a junction between $R_{11}$ and $D_1$ and connected to the negative terminal of the biasing voltage supply; and
a second biasing resistor $R_{22}$ connected to a junction between $R_{12}$ and $D_2$ and connected to the negative terminal of the biasing voltage supply.

2. The predistortion circuit with concave characteristic according to claim 1, wherein the amplifier is a class-AB solid-state power amplifier (SSPA).

3. The predistortion circuit with concave characteristic according to claim 1, wherein for any arbitrary impedance level of the predistortion circuit, the values of $R_A$ and $R_B$ are dependent on the values of $V_m/3$ and $V_1$ which define a point in the first region on the concave characteristic, the first region operation being characterized by the relation, $$V_1 = \frac{V_m}{3}\frac{R_B}{R_A + R_B}.$$

4. The predistortion circuit with concave characteristic according to claim 3, wherein:
operation of the passive network in the second region is characterized by the relations, $$\frac{(V_m/3) + V_{DC}}{R_{11} + R_{21}}R_{21} - V_{DC} = V_1, \text{ (condition for diode } D_1 \text{ to conduct)}$$

$$\frac{(2V_m/3) - V_2}{R_A} + I_{D1} = \frac{V_2}{R_B},$$

$I_{D1}=I_0(\exp(V_{D1}/\eta V_T)-1)$, and $$I_{D1} = \frac{(2V_m/3) - (V_{D1} + V_2)}{R_{11}} - \frac{V_{DC} + (V_{D1} + V_2)}{R_{21}}; \text{ and}$$

values of $R_{11}$ and $R_{21}$ are characterized by a simultaneous solution of the second region characterization relations where $V_T$ is the thermal voltage and the constants $I_0$ and $\eta$ are experimentally determined.

5. The predistortion circuit with concave characteristic according to claim 4, wherein:
operation of the passive network in the third region is characterized by the relations, $$\frac{(2V_m/3)V_{DC}}{R_{12} + R_{22}}R_{22} - V_{DC} =$$
$$V_{22} \text{ (condition for diode } D_2 \text{ to conduct)} \frac{V_m - V_3}{R_A} + I_{D1} + I_{D2} = \frac{V_3}{R_B}$$

$I_{D1}=I_0(\exp(V_{D1}/\eta V_T)-1)$ $I_{D2}=I_0(\exp(V_{D2}/\eta V_T)-1)$ $$I_{D1} = \frac{V_m - (V_{D1} + V_3)}{R_{11}} - \frac{V_{DC} + (V_{D1} + V_3)}{R_{21}}$$

$$I_{D2} = \frac{V_m - (V_{D1} + V_3)}{R_{12}} - \frac{V_{DC} + (V_{D1} + V_3)}{R_{22}}; \text{ and}$$

values of $R_{12}$ and $R_{22}$ are characterized by a simultaneous solution of the third region characterization relations.

6. The predistortion circuit with concave characteristic according to claim 5, further comprising a variable gain linear amplifier operably connected in-line between the predistortion circuit and the amplifier.

\* \* \* \* \*